(12) United States Patent
Arai

(10) Patent No.: US 6,259,330 B1
(45) Date of Patent: Jul. 10, 2001

(54) RING OSCILLATOR HAVING VARIABLE COARSE AND FINE DELAYS

(75) Inventor: Kouji Arai, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/465,709

(22) Filed: Dec. 17, 1999

(30) Foreign Application Priority Data

Dec. 17, 1998 (JP) ............................................. 10-359499

(51) Int. Cl.⁷ ........................................................ H03B 5/02
(52) U.S. Cl. ........................................... 331/57; 331/177 R
(58) Field of Search .................................. 331/57, 177 R

(56) References Cited

U.S. PATENT DOCUMENTS 5,382,921 * 1/1995 Estrada et al. ............................ 331/57
5,691,669 * 11/1997 Tsai et al. ................................ 331/57

FOREIGN PATENT DOCUMENTS

| 2-210908 | 8/1990 | (JP) . |
| 4-286417 | 10/1992 | (JP) . |
| 5-259844 | 10/1993 | (JP) . |
| 6-77782 | 3/1994 | (JP) . |

* cited by examiner

*Primary Examiner*—Siegfried H. Grimm

(57) ABSTRACT

A ring oscillator includes a coarse delay control block including a plurality of coarse delay gates, and a fine delay control block including a plurality of fine delay gates. The total delay of the fine delay control block is larger than a single delay step of the coarse delay control block, whereby variations of the delay step do not cause an adverse effect on the jitter characteristic of a PLL circuit having the ring oscillator. In a normal operation, the coarse delay control block increments the delay step after the total of the delay steps of the fine delay control block exceeds the delay step of the coarse delay control block.

8 Claims, 9 Drawing Sheets

RING OSCILLATOR HAVING VARIABLE COARSE AND FINE DELAYS

BACKGROUND OF THE INVENTION (a) Field of the Invention

The present invention relates to a ring oscillator having a variable delay and, more particularly, to a ring oscillator having a variable delay suitably used for a digital phase locked loop (PLL) circuit.

(b) Description of a Related Art

A ring oscillator having a variable delay (delay time) is generally used in a digital PLL circuit as a voltage controlled oscillator (VCO).

A Patent Publication JP-A-6-77782 describes a conventional ring oscillator having a variable delay, wherein the oscillation frequency range and the gain of the ring oscillator can be controlled. The ring oscillator includes a plurality of delay gates cascaded in a ring fashion. The delay gates are provided with a first control block for controlling the oscillation frequency of the delay gates at a coarse delay step by controlling the applied voltage or operational current of the delay gates. A second control bock is also provided for controlling the oscillation frequency of at least one of the delay gates at a fine delay step. By these configurations, the gain control separately from the oscillation frequency is possible in the ring oscillator, whereby fine control for the oscillator frequency can be effected. The second control block has fixed adjustment steps in the fine delay control.

The delay (delay time) of the ring oscillator largely affects the jitter characteristic of the digital PLL circuits, as in the case of the ring oscillator described in the above embodiment. The delay can be generally designed in the ring oscillator by using a simulation. However, it is difficult to compensate variations of delay of the ring oscillator caused by the fabrication process thereof between chips in a wafer or between lots or variations caused by environmental conditions of the ring oscillator. That is, the design for compensation of the variations at least increases the design steps for the ring oscillator, and yet effective compensation for the variations is difficult to achieve in the digital PLL circuit.

SUMMARY OF THE INVENTION

In view of the above, it is an object of the present invention to provide a ring oscillator which is capable of suppressing the adverse effects in a PLL circuit caused by the variations of the fabrication process and variations by the environmental conditions for the ring oscillator.

In one embodiment of the present invention, the ring oscillator includes a coarse delay control block including a plurality of coarse delay gates each effecting a first delay, a fine delay control block including a plurality of fine delay gates each effecting a second delay, the coarse delay control block and the fine delay control block being connected in a feed-back loop for effecting an overall delay of the ring oscillator, the first delay being larger than the second delay and smaller than a total of the second delays in the fine delay control block.

In accordance with the ring oscillator of the present invention, since the total delay of the fine delay control block is made larger than the delay step of the coarse delay control block, the maximum overall delay step of the ring oscillator is not larger than the second delay of the fine delay control block even if the variations of the first delay or second delay occur. Thus, the jitter characteristic of a PLL circuit having the ring oscillator of the present invention can be improved.

In the conventional ring oscillator, there is a problem in that the variations of the first delay or the second delay due to variations in the fabrication process may increase the first delay or may reduce the second delay step so that the total of the second delays is lower than the first delay. In this case, the variations generate a larger delay step at the shift stage of the ring oscillator when the ring oscillator shifts the delay step of the coarse delay control block by one step, whereby the oscillator frequency fluctuates at the shift stage and a problem jitter is involved.

The above and other objects, features and advantages of the present invention will be more apparent from the following description, referring to the accompanying drawings.

PREFERRED EMBODIMENTS OF THE INVENTION

Now, the present invention is more specifically described with reference to accompanying drawings.

Figure 1:
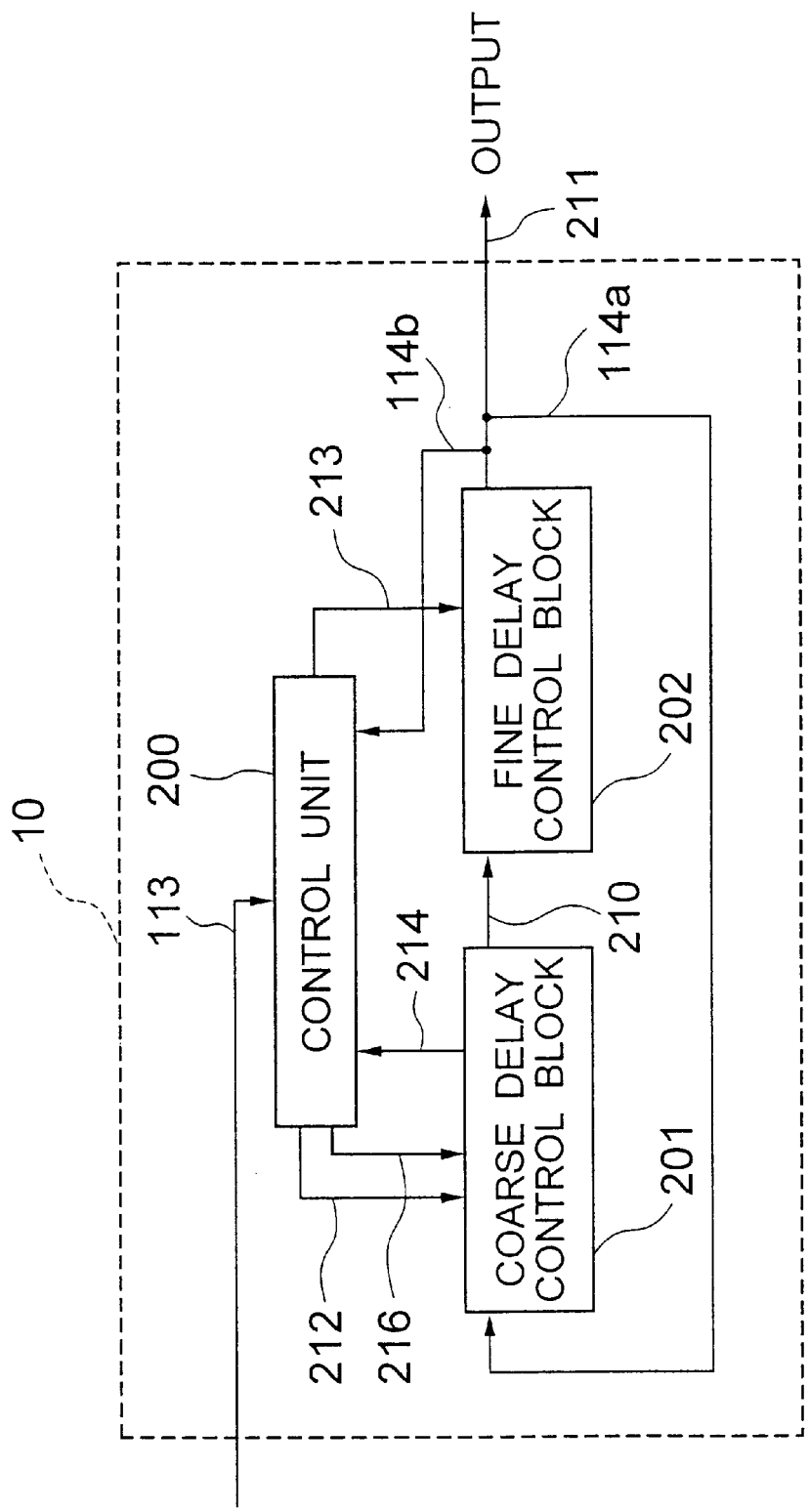
FIG. 1 is a block diagram of a ring oscillator according to an embodiment of the present invention.

Referring to FIG. 1, a ring oscillator, generally designated by numeral 10, according to an embodiment of the present invention includes a coarse delay control block 201 for generating a coarse delay with respect to the phase of an input signal 114a supplied thereto, a fine delay control block 202 for generating a fine delay with respect to an output signal 210 from the coarse delay control block 201, and a control unit 200 for receiving an external control signal 113 supplied from outside the ring oscillator 10 to generate a pair of control signals 212 and 216 for controlling the coarse delay control block 201 and a control signal 213 for controlling the fine delay control block 202. An output signal from the fine delay control block 202 is fed-back as the input signal 114a of the coarse delay control block 201. The output signal 114a of the fine delay control block 202 is delivered as an output signal 211 of the ring oscillator 10.

Figure 2:
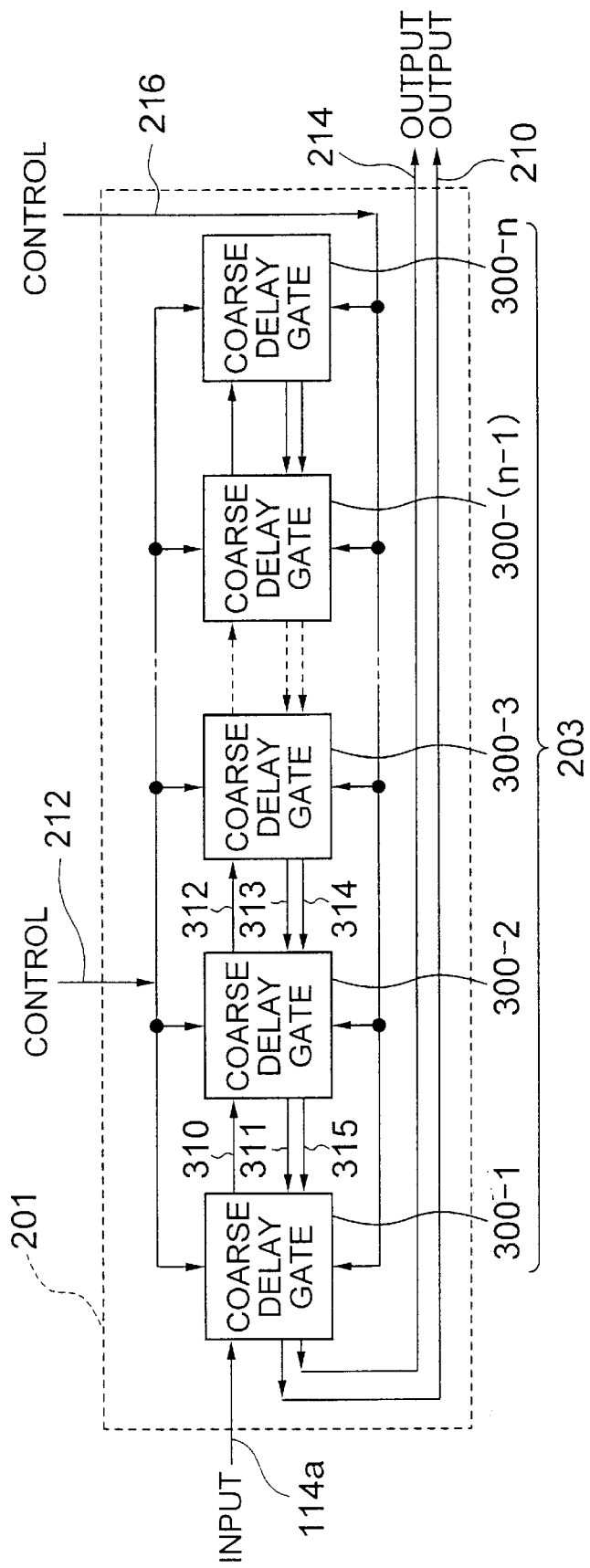
FIG. 2 is a block diagram of the coarse delay control block shown in the ring oscillator of FIG. 1.

Referring to FIG. 2, the coarse delay control block 201 shown in FIG. 1 includes a delay gate group 203 including a plurality (n) of cascaded coarse delay gates 300-1 to 300-n each controlled by the control signals 212 and 216. The first-stage coarse delay gate 300-1 receives the output signal 114a from the fine delay control block 202, whereas the first stage coarse delay gate 300-1 delivers the output signal 210 to the fine delay control block 202 and an output signal 214 to the control unit 200.

The first-stage coarse delay gate 300-1 delivers an output signal 310 to the second-stage coarse delay gate 300-2, which delivers an output signal 312 to the third-stage coarse delay gate 300-3 and also delivers output signals 311 and 315 to the first-stage coarse delay gate 300-1. The N-th stage coarse delay gate 300-N receives an output signal from the preceding-stage coarse delay gate and a pair of output signals from the succeeding stage coarse delay gate, and delivers an output signal to the succeeding stage coarse delay gate and a pair of output signals to the preceding-stage coarse delay gate. In these configurations, a pair of output signals from the intermediate-stage coarse delay gate or the final-stage coarse delay gate 300-n are delivered through the preceding-stage coarse delay gates to the first-stage coarse delay gate 300-1. The delays of the output signals 210 and 214 of the coarse delay control block 201 with respect to the input signal 114a thereof correspond to the number of stages of the coarse delay gates 300 through which the input signal 114a passes or the number of the coarse delay gates 300 which the input signal 114a bypasses.

Figure 3:
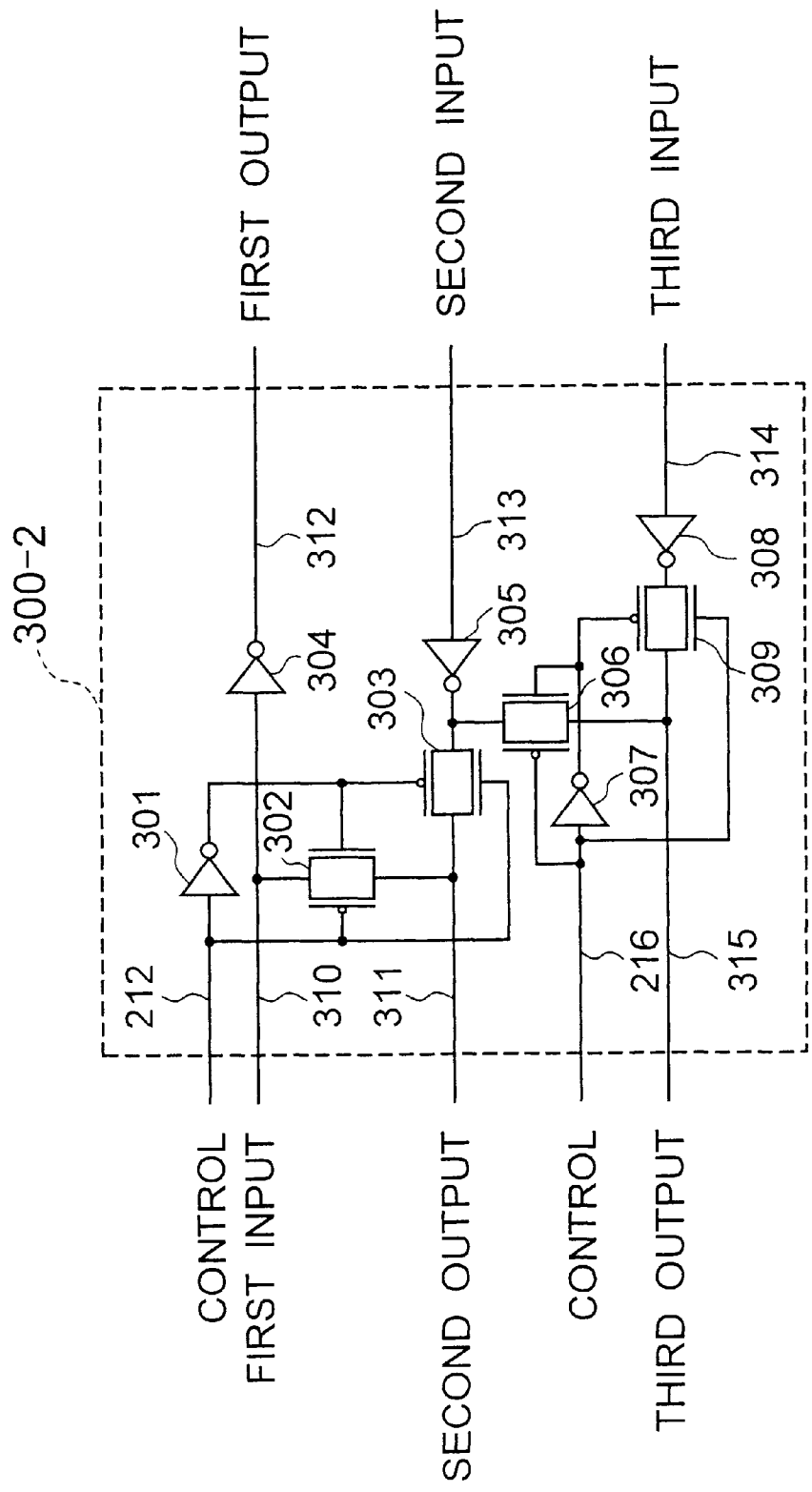
FIG. 3 is a circuit diagram of the second-stage coarse delay gate in the coarse delay control block shown in FIG. 2.

Referring to FIG. 3, the second-stage coarse delay gate 300-2, for example, shown in FIG. 2 includes a pair of inverters 301 and 305 and a pair of transfer gates 302 and 303, all of which associatively operate for selection of the output signal 310 from the first-stage delay gate 300-1 or the output signal 313 from the third-stage delay gate 300-3, to deliver the output signal 311 of the second-stage delay gate 300-2. The transfer gates 302 and 303 are controlled by the control signal 212.

The second-stage coarse delay gate 300-2 further includes an inverter 304 for passing the output signal 310 from the first-stage coarse delay gate 300-1 to the third-stage coarse delay gate through the first input terminal as an output signal 312. The second-stage coarse delay gate 300-2 further includes a pair of inverters 307 and 308 and a pair of transfer gates 306 and 309, all of which associatively select the output signal 313 from the third-stage coarse delay gate 300-3 or the output signal 314 from the fourth-stage coarse delay gate 300-4 to deliver the output signal 315 of the second-stage coarse delay gate 300-2 to the first-stage coarse delay gate 300-1. The transfer gates 306 and 309 are controlled by the control signal 216.

Figure 4:
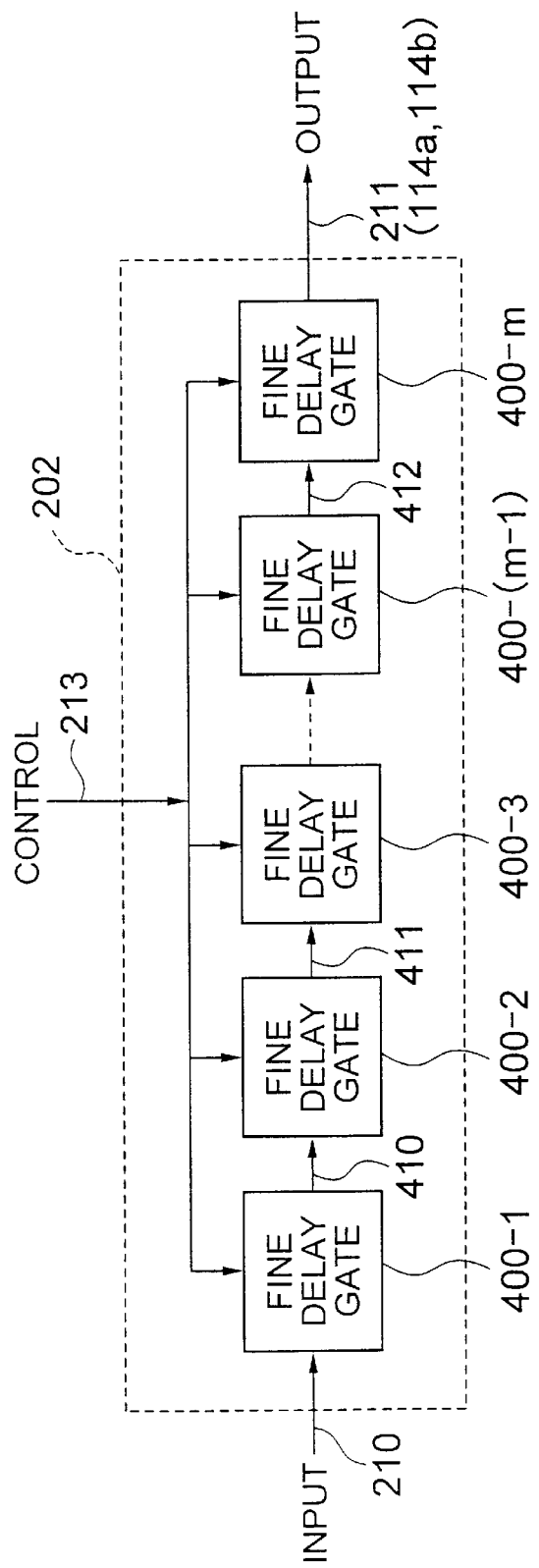
FIG. 4 is a block diagram of the fine delay control block shown in the ring oscillator of FIG. 1.

Referring to FIG. 4, the fine delay control block 202 shown in FIG. 1 includes a plurality (m) of cascaded fine delay gates 400-1 to 400-m each controlled by the control signal 213. The first-stage fine delay gate 400-1 receives the output signal 210 from the coarse delay control block 201, the intermediate-stage fine delay gates receive output signals from the precedent-stage fine delay gates to deliver an output signal to the succeeding-stage fine delay gates, and the final-stage fine delay gate 400-m delivers the output signal 211. The delayed output signal 211 is delivered as feed-back signals 114a and 114b. The delay of each fine delay gate 400 is controlled by the control signal 213 having a plurality of bits, and the number of stages of the fine delay gates is determined in the design stage thereof in consideration of margins for characteristic variations due to the variations in the fabrication process.

Figure 5:
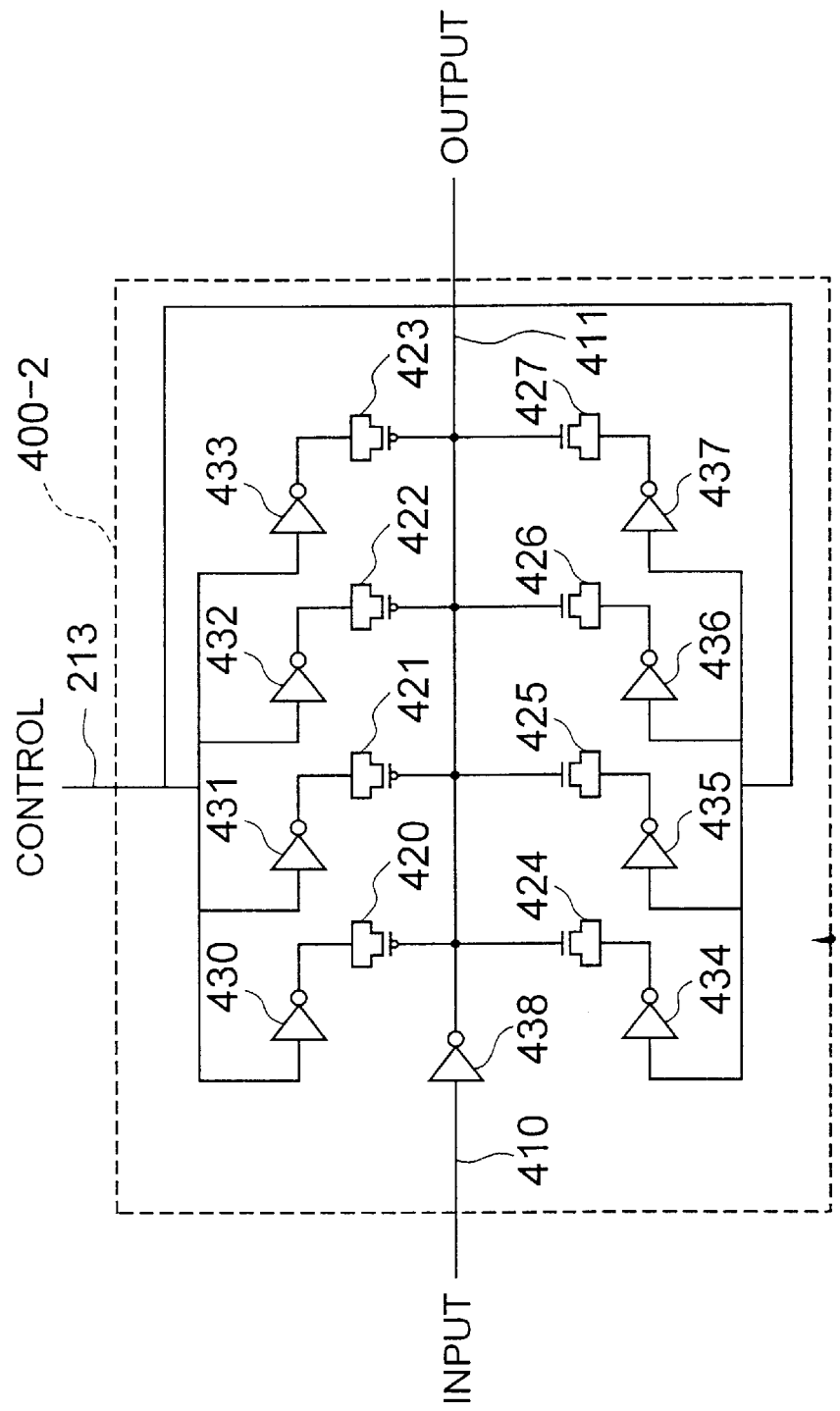
FIG. 5 is a circuit diagram of the second-stage fine delay gate shown in the fine delay control block of FIG. 4.

Referring to FIG. 5, the second-stage fine delay gate 400-2, for example, shown in FIG. 4, includes inverters 430 to 437 each receiving the control signal 213 at the input thereof. The outputs of inverters 430 to 433 are connected to nodes for coupling source/drain electrodes of respective p-channel transistors 420 to 423, whereas the outputs of inverters 434 to 437 are connected to nodes for coupling source/drain electrodes of respective n-channel transistors 424 to 427. The fine delay gate 400-2 further includes an inverter 438 having an input for receiving an output signal 410 from the first-stage fine delay gate 400-1 and an output connected to the gates of transistors 420 to 427 and an output line 411 of the second-stage fine delay gate 400-2. Each of the transistors 420 to 427 functions as a MOS capacitor.

Figure 6:
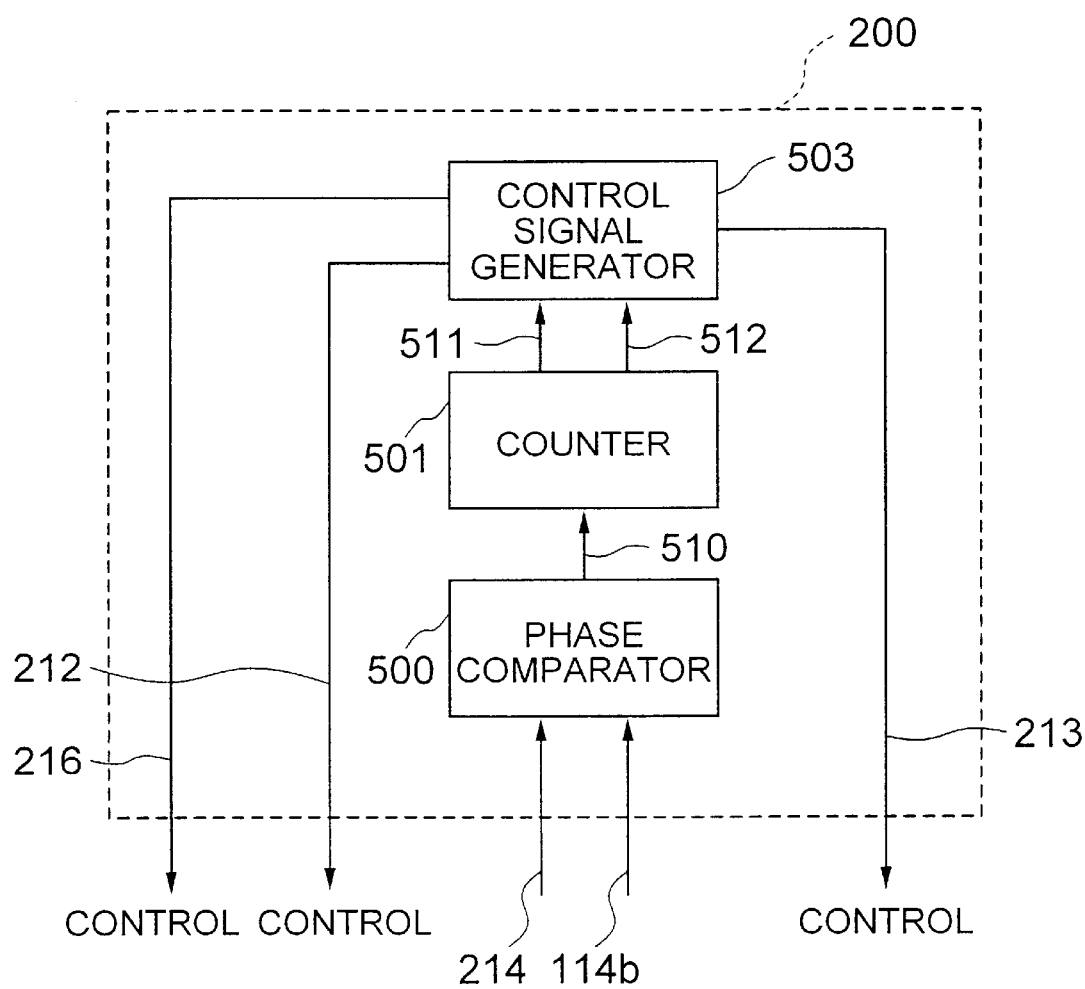
FIG. 6 is a block diagram of the control unit shown in the ring oscillator of FIG. 1.

Referring to FIG. 6, the control unit 200 shown in FIG. 2 includes a phase comparator 500 for comparing the output signal 214 from the coarse delay control block 201 and the feed-back signal 114b supplied from the fine delay control block 202 to output a phase difference signal 510 which represents a phase difference therebetween, a counter 501 for receiving the phase difference signal 501 to output count signals 511 and 512, and a control signal generator 503 for generating control signals 212, 213 and 216 based on the count signals 511 and 512.

Figure 7:
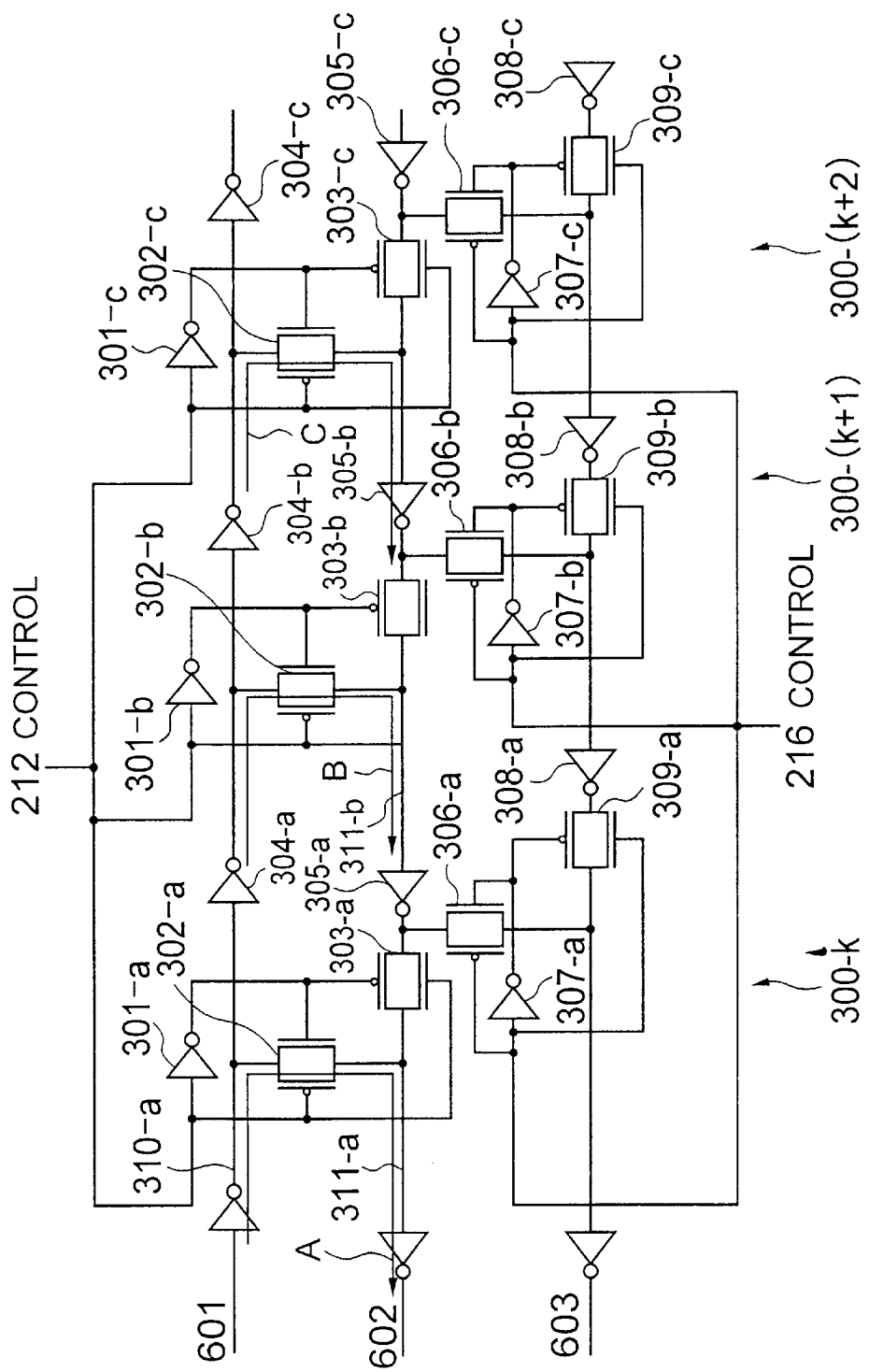
FIG. 7 is a circuit diagram of successive three stages of the coarse delay gates in the coarse delay control block in FIG. 2.

Referring to FIG. 7, there are shown details of three consecutive stages of the coarse delay gates 300-k, 300-(k+1) and 300-(k+2) among the coarse delay gates of FIG. 2, which have a configuration similar to that shown in FIG. 3.

Assuming that it is desired for the output signal 603 to have a one-step phase difference, equal to the delay effected by a single stage of the coarse delay gates, with respect to the output signal 602, the transfer gates are controlled by the control signals 212 and 216 based on Table-1 shown below depending on the delays of the signals 602 and 603 with respect to the input signal 601.

TABLE 1

| Transfer gate | First delay | Second delay | Third delay |
| --- | --- | --- | --- |
| 302-a | ON | OFF | OFF |
| 303-a | OFF | ON | ON |
| 306-a | ON | OFF | OFF |
| 309-a | OFF | ON | ON |
| 302-b | ON | ON | OFF |
| 303-b | OFF | OFF | ON |
| 306-b | ON | ON | OFF |
| 309-b | OFF | OFF | ON |
| 302-c | Arbitrary | ON | ON |
| 303-c | Arbitrary | OFF | OFF |
| 306-c | Arbitrary | ON | ON |
| 309-c | Arbitrary | OFF | OFF |

Each of the first to third delays represents a combination of delays for output signals 602 and 603 with respect to input signal 601, wherein the third delay is larger than the second delay, which is larger than the first delay, with the phase difference between signals 602 and 603 being equal to the delay of a single stage of the coarse delay gates.

In the first delay column in Table-1, the on-state of transfer gate 302-a and the off-state of transfer gate 303-a open path "A" for allowing the input signal 601 to be output as the output signal 602, whereas the on-state of transfer gate 302-b, the off-state of transfer gate 303-b, the on-state of transfer gate 306-a and the off-state of transfer gate 309-a open path "B" for allowing the input signal 601 to be output as the output signal 603. The states of inverter 306-b and transfer gate 309-b are not significant for signal 601 to advance as signals 602 and 603 in this case. In this configuration, the first delay is the lowest delay combination for signals 602 and 603, with the phase difference between signal 602 and signal 603 corresponding to the delay of a single stage of the coarse delay gates.

A larger phase delay combination for signals 602 and 603 with respect to signal 601, that is, the second delay in Table-1 is obtained by the levels of control signals 212 and 216 which raise the inputs of inverters 301-a and 307-a to a high level, and lower the inputs of inverters 301-b, 307-b, 301-c and 307-c to a low level. This provides the states of inverters specified in the "second delay" column in Table-1. In this case, the input signal 601 advances through path "B" to be output as the output signal 602, and advances through path "C" to be output as the output signal 603, with the phase difference between the output signals 602 and 603 being maintained at the delay of a single stage of the coarse delay gates.

For a larger delay combination, that is, the third delay, the levels of the control signals 212 and 216 are such that inputs of inverters 301-a, 307-a, 301-b and 307-b rise to a high level, and the input of inverters 301-c and 307-c fall to a low level, whereby the states of transfer gates shown on the "third delay" column can be obtained. In this configuration, the phase difference between signals 602 and 603 is maintained at the delay of a single stage of the coarse delay gates.

As described above with respect to the three examples, the coarse delay control block 201 generates a phase delay corresponding to the number of stages passed by the input signal.

In FIG. 5, each fine delay gate 400 in the fine delay control block 202 is controlled by the control signal 213 for controlling the voltages of the source/drain nodes of MOSFETs 420 to 427, whereby the load capacitance of the output line of each fine delay gate 400 is controlled. This provides a fine control for the delay in the output signal 211 of the fine delay control block 202 shown in FIG. 4.

Figure 8:
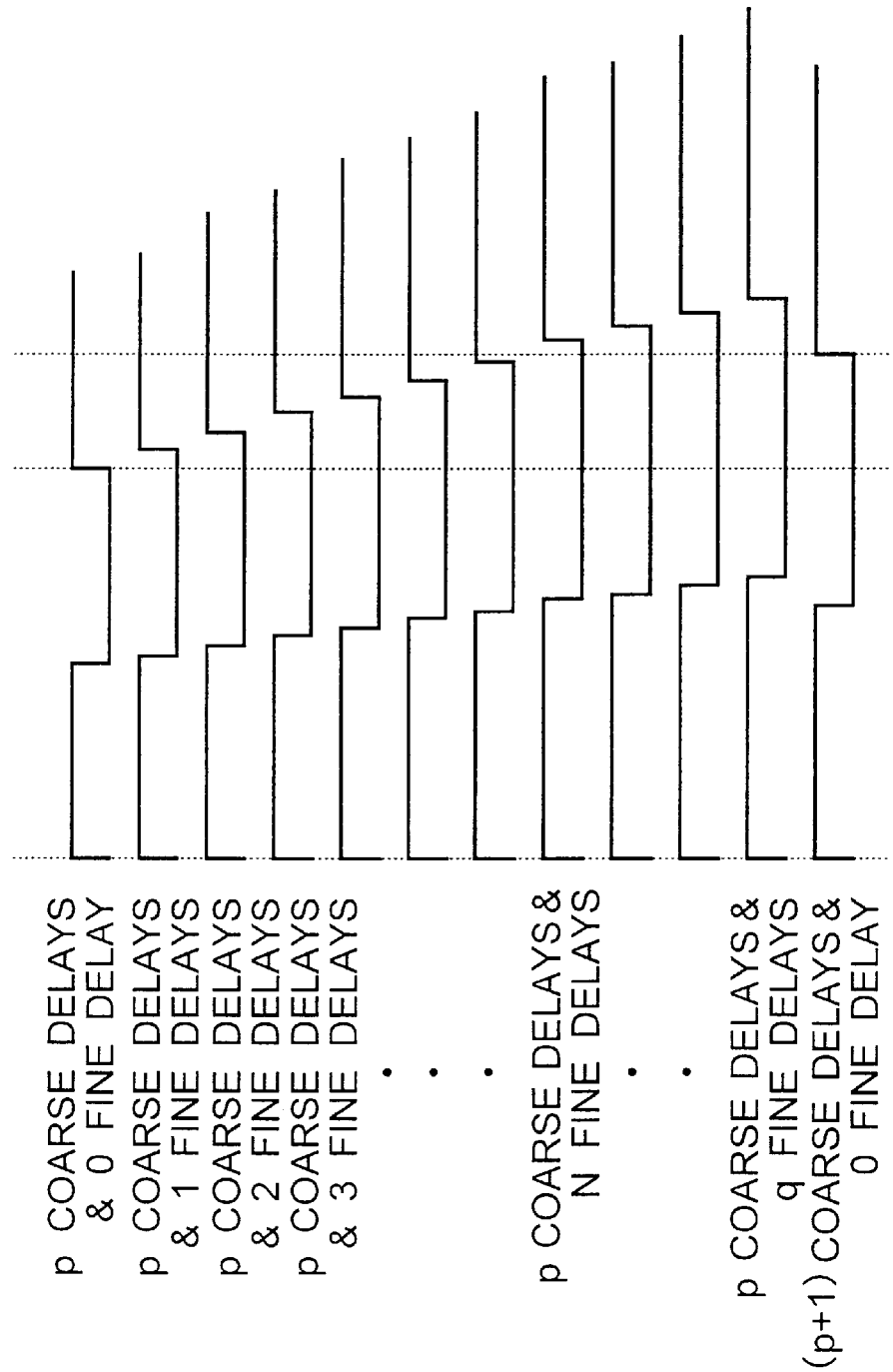
FIG. 8 is waveform diagrams of the feed-back signal.

Referring to FIG. 8, in operation of the control unit 200, the coarse delay control block 201 and the fine delay control block 202 are controlled to generate one of the overall delays shown in the drawing. The depicted waveforms correspond to the numbers of stages of the fine delay gates effecting delays with respect to the input signal, with the number (p) of coarse delay gates being constant except for the bottom waveform, which corresponds to a zero delay by the fine delay gates, with the number of stages of the coarse delay gates being equal to the number (p+1) of the stages. In this example, the total number of fine delay gates is assumed to be "q".

In a normal operation of the ring oscillator, the number of the stages for the fine delay gates is increased one by one to increase the overall delay of the output signals with respect to the input signal. During the increase of the number of stages for the fine delay gates with the number of the coarse delay gates being maintained at the number "p", there is a step point at which the overall delay effected by "N" stages of the fine delay gates and "p" stages of the coarse delay gates exceeds the overall delay which is effected by "p+1" stages of the coarse delay gates and a zero stage of the fine delay gates.

The step point is detected by the phase comparator 500 which compares the output signal 214 against the feed-back signal 114b. If the step point is detected, the control unit 200 selects "p+1" stages of the coarse delay gates by the function of the counter 201 and also selects the zero stage of the fine delay gates, when the delay is to be further increased. The ring oscillator then iterates the increase of the number of the fine delay gates after the step operation.

The step point at which the number of coarse delay gates is increased varies chip by chip or lot by lot depending on the variations of the fabrication process, or varies ring oscillator by ring oscillator depending on the environmental conditions. However, in the present embodiment, the adjustment step is equal to or lower than the step of the fine delay control block at any time, whereby the adverse effect on the jitter characteristic caused by the variations can be eliminated in the ring oscillator.

Figure 9:
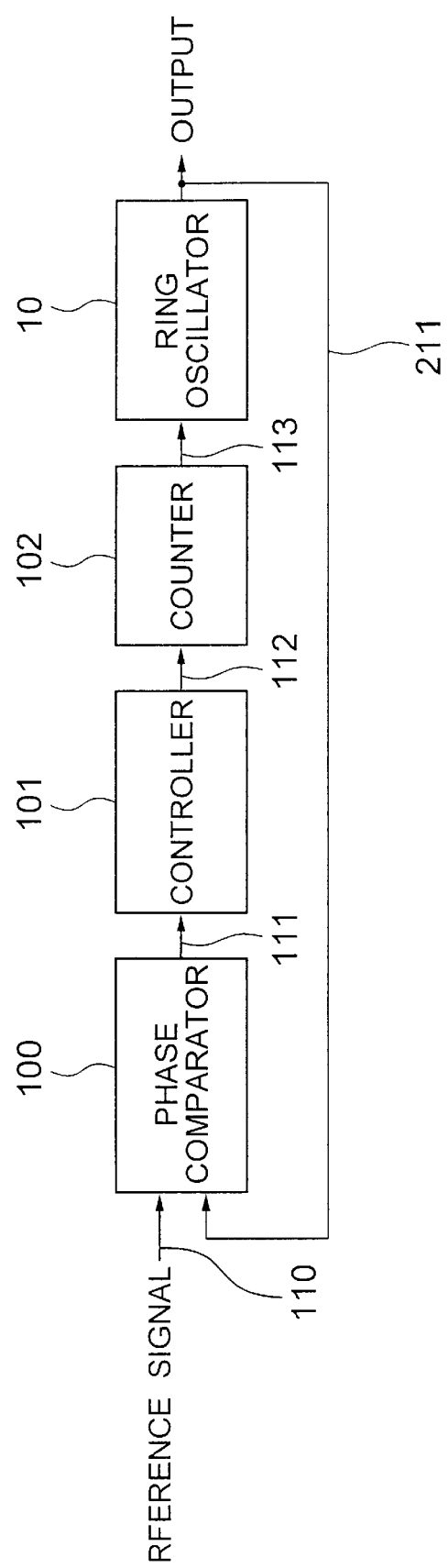
FIG. 9 is a block diagram of a PLL circuit having the ring oscillator of FIG. 1.

Referring to FIG. 9, a digital PLL circuit having the ring oscillator of the present embodiment includes a phase comparator 100 for comparing the output feed-back signal 211 of the ring oscillator 10 against an input reference signal 110 to deliver a phase difference signal 111, a controller 101 for receiving the phase difference signal 111 to deliver an UP/DOWN count signal 112, a counter for receiving the UP/DOWN count signal 112 to deliver a ring control signal 113 to the ring oscillator 10. The ring oscillator 10 oscillates at the frequency specified by the ring control signal 113.

The digital PLL circuit of FIG. 9 operates at a frequency based on the input reference signal 110, and delivers the feed-back signal 211 as an output signal thereof. In the digital PLL circuit of FIG. 9, variations caused by the fabrication process or environmental conditions do not substantially affect the jitter characteristic of the PLL circuit.

Since the above embodiments are described only for examples, the present invention is not limited to the above embodiments and various modifications or alterations can be easily made therefrom by those skilled in the art without departing from the scope of the present invention. For example, the delays of the coarse delay gates need not be equal to one another, and the delays of the fine delay gates need not be equal to one another.

What is claimed is:

1. A ring oscillator comprising a coarse delay control block for effecting a plurality of delay steps each equal to or not smaller than a first delay, a fine delay control block for effecting a plurality of delay steps each equal to or not larger than a second delay, said coarse delay control block and said fine delay control block being connected in a feed-back loop for effecting an overall delay of said ring oscillator, said first delay being larger than said second delay and smaller than a total of said plurality of delay steps of said fine delay control block.

2. The ring oscillator as defined in claim 1, wherein said coarse delay control block includes a plurality of coarse delay gates each effecting said first delay, and said fine delay control block includes a plurality of fine delay gates each effecting said second delay.

3. The ring oscillator as defined in claim 1, further comprising a control unit for controlling said coarse delay control block and said fine delay control block so that said coarse delay control block increments one of said delay steps after the total of said delay steps of said fine delay control block exceeds each of said delay steps of said coarse delay control block.

4. The ring oscillator as defined in claim 3, wherein said control unit comprises a phase comparator for comparing an output of said coarse delay control block and an output of said fine delay control block to deliver a comparison result signal, and a controller for controlling said coarse delay control block and said fine delay control block based on said comparison result signal.

5. The ring oscillator as defined in claim 2, wherein each of said coarse delay gates includes first and second input terminals, first and second output terminals, a first transfer gate for coupling said first input terminal to said second output terminal, a first inverter having an input connected to said first input terminal and an output connected to said first output terminal, a second inverter having an input connected to said second input terminal, and a second transfer gate for coupling an output of said second inverter to said second output terminal.

6. The ring oscillator as defined in claim 5, wherein each of said coarse delay gates further comprises a third input terminal, a third output terminal, a third transfer gate for coupling said output of said second inverter to said third output terminal, a third inverter having an input connected to said third input terminal, and a fourth transfer gate for coupling an output of said third inverter to said third output terminal.

7. The ring oscillator as defined in claim 2, wherein each of said fine delay gates comprises a first input terminal, a first output terminal, an inverter having an input connected to said first input terminal and an output connected to said first output terminal, and a plurality of capacitors each connected between said first output terminal and a control line.

8. The ring oscillator as defined in claim 7, wherein each of said capacitors is implemented by a MOS capacitor.

* * * * *